United States Patent [19]

Takahashi et al.

[11] Patent Number: 5,084,355
[45] Date of Patent: Jan. 28, 1992

[54] LAMINAR STRUCTURE COMPRISING ORGANIC MATERIAL AND INORGANIC MATERIAL

[75] Inventors: Shigeru Takahashi, Hitachiota; Takuya Fukuda, Hitachi; Toshiya Satoh, Hitachi; Seikichi Tanno, Hitachi; Michio Ohue, Hitachi; Naohiro Momma, Hitachi; Yutaka Misawa, Katsuta, all of Japan

[73] Assignee: Hitachi, Ltd., Tokyo, Japan

[21] Appl. No.: 336,788

[22] Filed: Apr. 13, 1989

[30] Foreign Application Priority Data

Apr. 13, 1988 [JP] Japan .................................. 63-89103
Aug. 12, 1988 [JP] Japan ................................ 63-199886

[51] Int. Cl.$^5$ ............................................. B32B 15/04
[52] U.S. Cl. ................................... 428/457; 428/900; 428/901
[58] Field of Search ................ 428/698, 457, 900, 901

[56] References Cited

U.S. PATENT DOCUMENTS 4,943,486 7/1990 Uchiyama ...................... 428/698 X

FOREIGN PATENT DOCUMENTS 46413 2/1982 European Pat. Off. .
187706 7/1986 European Pat. Off. .
206145 12/1986 European Pat. Off. .
2478113 9/1981 France .

OTHER PUBLICATIONS

Journal of Vacuum Science & Technology, vol. A5, No. 6.
Patent Abstract of Japan, vol. 11, No. 062.
Patent Abstracts of Japan, vol. 10, No. 63.
Patent Abstracts of Japan, vol. 10, No. 382.
Patent Abstracts of Japan, vol. 12, No. 180.

Primary Examiner—Thomas J. Herbert, Jr.
Attorney, Agent, or Firm—Antonelli, Terry, Stout & Kraus

[57] ABSTRACT

A laminar structure comprising an organic material and an inorganic material; for example, a coating structure on an organic substrate comprising an organic material on which an inorganic film must be formed and a method of producing the structure, a structure which is suitable for increasing the reliability of an optical disk and a method of producing this, a wiring structure on an organic substrate comprising the organic material on which electric wiring must be formed and a method of producing this, and a structure suitable for increasing the reliability of a semiconductor integrated circuit device and a method of producing this. In order to provide a laminar structure which exhibits a high degree of reliability with respect to prevention of cracks or separation and which comprises an organic material and an inorganic material and a method of producing this structure and a device which utilizes this structure, the present invention provides a laminar structure on an organic substrate comprising the organic substrate comprising an organic material and a thin film which is caused to adhere to the surface of the organic substrate and which comprises an inorganic material a second element which produces a metal bonding or covalent bonding with the first element that forms the thin film being contained in the organic substrate in the vicinity of the surface thereof.

5 Claims, 4 Drawing Sheets

μ WAVE
2.45GHz

μ WAVE
2.45GHz

μ WAWE
2.45GHz

LAMINAR STRUCTURE COMPRISING ORGANIC MATERIAL AND INORGANIC MATERIAL

BACKGROUND OF THE INVENTION

The present invention relates to a laminar structure comprising an organic material and an inorganic material, or a multi-level structure consisted of organic and inorganic compounds. For example, the present invention relates to the structure of a coating on an organic substrate made of an organic material on which an inorganic film must be formed and a method of production thereof, a structure which is suitable for increasing the reliability of an optical disk and a method of production thereof, the structure of wiring on an organic substrate made of an organic material on which electrical wiring must be formed and a method of production thereof, and a structure which is suitable for increasing the reliability of a semiconductor integrated circuit device and a method of production thereof.

When an inorganic film is formed on an organic material, separation or cracks generally occur immediately after the films have been formed because the difference between the coefficients of linear expansion of the two materials is typically about one order of magnitude or more. Means for solving such a problem are the following methods:

A means is disclosed in Japanese Patent Unexamined Publication No. 38746/1985 in which the stress produced owing to the difference between the coefficients of linear expansion of two materials is relieved by inserting a material with a coefficient of linear expansion that is at an intermediate value between those of the first two materials.

Japanese Patent Unexamined Publication No. 109247/1987 disclose in which a nitride film or an oxide film is formed on a plastic substrate while a negative bias voltage is applied thereto by a sputtering apparatus using a sintered metal substance which is subjected to the ion impact of an inert gas, and in which a recording film is then formed thereon.

On the other hand, Japanese Patent Unexamined Publication No. 120642/1987 discloses a method in which an $Si_3N_4$ film is formed separately on an insulating film and recording film by decomposition of a monosilane ($SiH_4$) gas with $N_2$ plasma using electron cyclotron resonance plasma.

In each of the above-described methods, the film formed between the substrate and the recording film is an inorganic film composed of a metal compound such as SiO or $Si_3N_4$.

However, it was found that separation or cracks occur in the metal compound films after the passage of a relatively short time (for example, 100 to 200 hours) in high-temperature high-humidity tests (for example, 60° C. and 95% RH), and thus the structures formed by the above-described prior art exhibit low degrees of strength, durability or reliability.

In the structure of multilayer interconnection in LSI elements or the like, an organic material such as polyimide resin is sometimes used in an interlayer film. In this case, the reaction of the organic material with an inorganic material such as a metal wiring material in some cases causes metal ions to enter the organic material which is thus degraded, depending upon the type of inorganic material used.

As a method of removing the above-described problem, a method is considered in which a thin film which does not react with either an inorganic material such as a wiring material or an organic material is interposed between these materials.

In addition, when an inorganic material such as a metal wiring film is formed on an organic material, since the coefficients of linear expansion of the two materials greatly differ from each other, and since the organic material is not easily bound with the inorganic film in a direct manner, a low adhesive force between these materials causes separations or cracks immediately after the film has been formed. As a means for solving this problem, a sintered metal substance is generally formed in a plasma by a sputtering apparatus using the ion impact of an inert gas.

As described above, films respectively formed between organic substrates and wiring materials are inorganic films composed of a metal compound such as SiO or $Si_3N_4$.

However, it was found that the substrate formed by the above-described prior art produces separation in the metal compound film at 50 g/cm in a tension test and thus exhibits a low degree of strength, durability or reliability.

SUMMARY OF THE INVENTION

It is an object of the present invention to provide a laminar structure which exhibits a high level of reliability with respect to the occurrence of cracks or separations and which comprises an organic material and an inorganic material, and a method of producing this laminar structure or a device which utilizes the same.

In order to achieve these objects, the present invention provides a laminar structure having an organic substrate and a thin film which is composed of an inorganic material coated on the surface of the organic substrate, a second element which produces a metal bond or a covalent bond with the first element contained in the thin film being contained in the vicinity of the surface of the organic substrate. The first element is preferably at least one element selected from the group consisting of Si (silicon), Ti (titanium), Ta (tantalum), Al (aluminum), C (carbon), Zr (zirconium), In (indium), Sn (tin), Mo (molybdenum), Cr (chromium), Ge (germanium), Mg magnesium) and Mn (manganese). The second element is preferably at least one element selected from the group consisting of Si (silicon), Ti (titanium), Ta (tantalum), Al (aluminum), C (carbon), Zr (zirconium), In (indium), Sn (tin), Mo (molybdenum), Cr (chromium), Ge (germanium), Mg (magnesium) and Mn (manganese).

For example, the thin film is preferably formed by using as a main material at least one material selected from the group consisting of silicides, oxides, nitrides, carbides and fluorides.

An example of the laminar structure which enables the achievement of the above-described object is an optical recording disk having an optical recording medium layer coated with a predetermined protection layer, a primary coat coated with the optical recording medium layer and an organic substrate having a surface to which the primary coat adheres, an element which produces a metal bonding with the element comprising the primary coat being contained in the organic substrate at least in the vicinity of the adhesion surface between the primary coat and the organic substrate.

A method of producing the laminar structure which enables the achievement of the object of the present invention comprises the steps of implanting a given element in the vicinity of the surface of an organic substrate and causing a thin film containing a given element to adhere ti the organic substrate.

It is another object of the present invention to provide a wiring structure on an organic substrate exhibiting a high degree of reliability with respect to the prevention of cracks and separation and to a method of producing the wiring structure or a device which utilizes the same.

In order to achieve the above-described object, the present invention provides a wiring structure on an organic substrate having a thin film adhering to the surface of the organic substrate and a predetermined wiring metal material formed of the thin film, a second element which produces a metal bonding or covalent bonding with the first element forming the thin film being contained in the vicinity of the surface of the organic substrate. The first element is preferably at least one element selected from the group consisting of Si (silicon), Ti (titanium), Ta (tantalum), Cu (copper), Al (aluminum), C (carbon), Zr (zirconium), In (indium), Sn (tin), Mo (molybdenum), Cr (chromium), Ge (germanium), Mg (magnesium) and Mn (manganese). The second element is preferably at least one element selected from the group consisting of Si (silicon), Ti (titanium), Ta (tantalum), Cu (copper), Al (aluminum), C (carbon), Zr (zirconium), In (indium), Sn (tin), Mo (molybdenum), Cr (chromium), Ge (germanium), Mg (magnesium), and Mn (manganese).

An example of the device that enables the achievement of the above-described other object is a semiconductor integrated circuit device having a wiring material layer coated with a given protection layer, a primary coat coated with the wiring material layer and an organic substrate with a surface to which the primary coat adheres, an element which produces a metal or covalent bonding with the element forming the primary coat being contained in the organic substrate at least in the vicinity of the adhesion surface between the primary coat and the organic substrate.

A method of producing the wiring structure on an organic substrate which enables the achievement of the above-described other object comprises the steps of implanting a given element in the vicinity of the surface of the organic substrate and causing a thin film containing a given element to adhere to the organic substrate.

Other characteristics of the present invention will be made apparent from the description below.

DESCRIPTION OF THE PREFERRED EMBODIMENTS

An example of the function of the present invention is described below with reference to FIG. 1.

Since a bonding between the same metal atoms is produced between the element contained in an inclusion region 3 in an organic substrate 1 in the vicinity of the surface thereof and the element which forms a thin film formed as an upper layer on the organic substrate, the organic substrate 1 and the thin film 2 have a very strong adhesive force therebetween.

It is therefore possible to achieve significant increases in the strength, reliability, and durability of the coating structure of the organic substrate adhering thereto.

Figure 5:
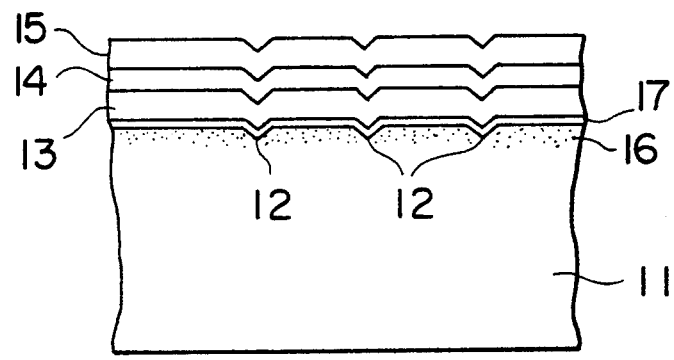
FIG. 5 is a longitudinal sectional view of an embodiment of a photoelectro-magnetic disk in accordance with the present invention.

FIG. 5 is a sectional view of a photoelectromagnetic disk substrate in an embodiment. In FIG. 5, reference numeral 11 denotes a polycarbonate resin substrate serving as an organic substrate; reference numeral 12, guide grooves; reference numeral 13, a silicon nitride (SiN) film; reference numeral 14, a magnetic recording film comprising Fe, Co, Nb, Tb or the like; and reference numeral 15, a protection silicon nitride film. The silicon nitride film 13 also has a Kerr enhancing effect of apparently increasing the Kerr rotational angle. The refractive index of the nitride film 13 is therefore generally 1.40 to 2.50, preferably 1.4 or more. A silicon-containing layer 16 in which silicon is implanted is formed in the polycarbonate resin substrate 11 in the vicinity of the surface thereof, a silicon-deposited layer being formed on the polycarbonate resin substrate 11. In the case of a photoelectro-magnetic disk, the thickness of the deposited layer 17 is preferably as small as possible, e.g., about 10 100Å. Although the silicon-deposited layer 17 may not be formed, the deposited layer 17 functions as a buffer layer for buffering the difference between the stresses of the polycarbonate resin substrate 11 and the SiN film 13 and is thus capable of coping with a heat cycle in a severe environment. In this embodiment, the structure shown in FIG. 5 is formed by, for example, the electromagnetic field control-type microwave plasma CVD apparatus 100 shown in FIG. 2, which is a microwave plasma treatment apparatus. A description will now be given of the production method and the procedure of production.

EXAMPLE 1

The polycarbonate substrate 11 was first placed in a sample chamber 101. A plasma was generated in an atmosphere of argon at $2 \times 10^{-3}$ Torr in a plasma generation chamber 103 using a microwave of 300 to 500 W which was introduced from a microwave waveguide 102. At the same time, a monosilane ($SiH_4$) gas was introduced at a rate of 6 cc/minute into the chamber 101 through nozzles 104 provided adjacent to the substrate 11. The $SiH_4$ gas was decomposed by Ar gas introduced from plasma generation nozzles 105 which are formed through the plasma generation chamber 103, whereby ionized silicon atoms are implanted in the polycarbonate substrate 11. The amount of the silicon atoms implanted was controlled by controlling the magnetic fields which were respectively produced by control magnetic coils 106, 107 provided outside a vacuum container. The two control magnetic coils 106, 107 were separately controlled so that the amount of the ions reaching the substrate 11 is increased by bringing an electron cyclotron resonance region (875 gauss) close to the substrate 11. In this embodiment, the distance between the substrate 11 and the electron cyclotron resonsance region was within the range of 0 to 12 cm. As a matter of course, since the lower the pressure, the longer the average free path of electrons, the pressure also greatly affects the implantation of silicon atoms in the substrate. After the silicon (atom)-containing layer 16 had been formed by the above-described method, the output of the microwave was reduced to 300 W or less, and the distance between the substrate 11 and the electron cyclotron resonance region was increased to 12 cm or more. In this state, the silicon-deposited layer 17 with a thickness of about 10 to 1000 Å was formed at the same pressure ($2 \times 10^{-3}$ Torr) or lower. Only the argon gas was then stopped (thus, the monosilane gas was caused to continuously flow), and nitrogen gas was caused to flow at a rate or 40 cc/minute to form the silicon nitride film 13 with a thickness of 1000 Å. The substrate 11 was transferred into another vacuum container in which the magnetic film 14 composed to Tb, Fe, Co, Nb and or like serving as a photoelectro-magnatic medium layer was so formed as to adhere to the silicon nitride film 13. The substrate 11 was then returned to the sample chamber 101 of the above-described electromagnetic field control-type microwave plasma CVD apparatus 100 in which the silicon nitride film 15 with a specified thickness serving as a protection film was formed by the same method as that described above to form the structure shown in FIG. 5.

The inventors also performed comparative experiments in which, after the substrate had been placed in the sample chamber, a plasma was generated using $N_2$ and then mixed with $SiH_4$ (that is, a silicon nitride film was deposited directly on the substrate 11) and in which, after the substrate had been placed in the sample chamber, a plasma was generated using $O_2$ and thus mixed with $SiH_4$ (that is, a silicon oxide film was deposited directly on the substrate 11). The results of high-temperature high-humidity tests showed that cracks or separations occur in the structures formed in the comparative experiments after the passage of only about 100 hours.

EXAMPLE 2

Figure 3:
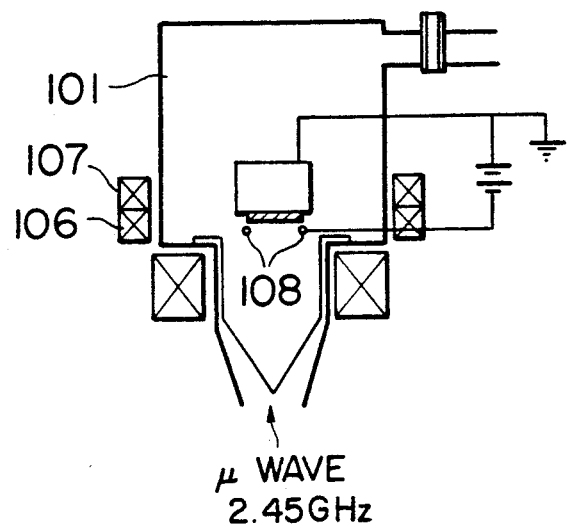
FIGS. 3 and 4 are respectively drawings of methods of applying an electric field in an embodiment of the production method in accordance with the present invention.

Another embodiment of the present invention was achieved by the following method:

$SiH_4$ gas at a rate of 60 cc/minute and an Ar gas at a rate of 40 cc/minute were caused to simultaneously flow while a negative bias voltage being applied to a grid electrode 108 which was provided adjacent to the substrate support base of the above-described electromagnetic filed control-type microwave plasma CVD apparatus 100, as shown in FIG. 3. At this time, Ar ions and Si atom ions generated by decomposition of $SiH_4$ were led in the grid electrode 108 and were thus implanted in the substrate 11 to form a silicon-containing layer 16. The $SiH_4$ and Ar gases were caused to continuously flow in the state wherein the potential of the grid electrode was zero to form a silicon-deposited layer 17 with a given thickness. Only the Ar gas was then stopped, and $N_2$ gas was caused to flow so that a silicon nitride film 13 with a thickness of 1000 Å is formed by reaction in a plasma of $SiH_4$ and $N_2$. A magnetic recording film 14 and a protection silicon nitride film 15 were then formed by the same method as that employed in Example 1.

EXAMPLE 3

Figure 4:
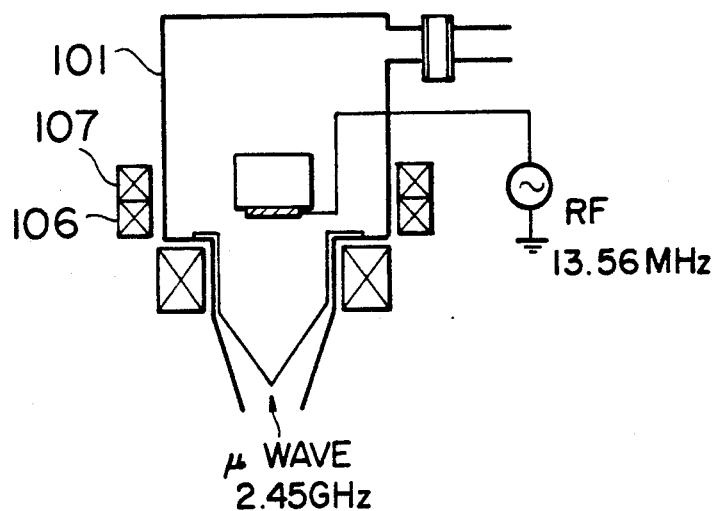

A further embodiment of the present invention was as follows:

A substrate 11 was placed in the sample chamber 101 of the above-described electromagnetic control-type microwave plasma CVD apparatus 100 provided with a high-frequency oscillator (FR), as shown in FIG. 4. A plasma was then generated with microwave output of 270 W at pressure of $2 \times 10^{-3}$ Torr and a flow rate of monosilane gas of 6 cc/minute and a flow rate of argon gas of 40 cc/minute, as well as RF output of 50 W being superposed on the side of the substrate 11, to form a silicon layer 16 in the polycarbonate resin in the vicinity of the surface thereof. The RF output was then cut off, and a silicon-deposited layer 17 was formed on the surface of the polycarbonate resin using only the output of 270 W. A silicon nitride film 13, a magnetic recording film 14 and a protection film 15 were then formed in turn by the same method as in FIG. 5 to form the same structure as that shown in FIG. 5.

EXAMPLE 4

A still further embodiment of the present invention was achieved by the following method:

A substrate 11 was placed in the sample chamber 101 of the electromagnetic field control-type microwave plasma CVD apparatus 100 provided with the RF oscillator. Plasma treatment was conducted using a gas mixture of monosilane gas at 6 cc/minute and argon gas at 40 cc/minute and only RF output of 300 to 500 W, without using any microwave output, at pressure of $5 \times 10^{-2}$ Torr or more to form a silicon-containing layer 16 and a silicon-deposited layer 17 on the surface thereof. A silicon nitride film 13, a magnetic recording film 14 and a protection film 15 were formed in turn in the same manner as in FIG. 5 to form the same structure as that shown in FIG. 5.

When each of the thus-formed optical disk media was subjected to a high-temperature high-humidity test at temperature of 60° C. and humidity of 95% or more, separation and cracks occurred in the silicon nitride film 13 in each of the conventional polycarbonate substrates having no silicon-containing layer 17 and silicon-deposited layer 18 after the passage of about 100 to 200 hours. While each of the polycarbonate substrates 11 of the present invention having the silicon-containing layer 16 and the silicon-deposited layer 17 involved no problem with respect to the occurrence either of separation or cracks even after the passage of 3000 hours.

On the other hand, examples using metals and semimetals as elements to be implanted in resin substrates are shown in Table 1. In all the cases, the substrates used were made of polycarbonate, and the method of implanting the elements was the same as that employed in Embodiment 3. The results of high-temperature high-humidity tests revealed that the examples are satisfactory without producing either separation or cracks.

TABLE 1

Examples using Other Elements

| Element implanted | Gas or liquid used | Method of generating plasma and implanting element | Time (min) | Compound of intermediate layer on implantation layer | Separation occurring in high-temperature high-humidity test |
|---|---|---|---|---|---|
| Ti | Ti*(OC$_2$H$_5$)$_4$ | μ wave (270 W) + RF (100 W) | 3 | TiN TiO$_2$ | No |
| Ta | Ta*(OC$_2$H$_5$)$_5$ | μ wave (270 W) + RF (100 W) | " | TaN Ta$_2$O$_3$ | No |
| C | CH$_4$ | μ wave (270 W) + RF (100 W) | " | SiC | No |
| Al | Al(CH$_3$)$_3$* | μ wave (270 W) + RF (100 W) | " | AlN Al$_2$O$_3$ | No |

*The liquid was introduced into the vacuum container while being bubbled with an Ar gas under heating In each of the Examples, the substrate was made of polycarbonate resin, the Kerr enhancing film and the protection film respectively comprised a silicon nitride film, the metal element to be implanted in the organic substrate was silicon, and the magnetic film was composed of Tb, Fe, Co or Nb. However, each of the substrates may be made of other plastics such as polymethacrylate, polyolefins, bisphenol, polyvinyl chloride, polyethylene terephthalate or the like, and the Kerr enhancing film may be composed of SiO, an oxide of In, Sn, Mo, Cr or Ge or a transparent metal compound such as a fluoride of Mg or Mn. In this case, it is necessary to use Ta, Ti and Al as an element to be implanted to the organic substrate in the cases of use of a Ta compound, a Ti compound and an Al compound, respectively. The magnetic film may be a rare earth-transition metal magnetic film.

In the production method of the present invention, although a given element is implanted in the organic substance using the microwave plasma and RF plasma, an element may be implanted using ion etching or an ion implantation method. A method in which SiH$_4$ gas and an Ar gas are mixed in a sputtering apparatus, and in which a negative bias voltage is applied to the substrate side exhibits the same effect as that described above.

For example, a method in which a single metal element is impregnated in a surface layer of the resin during the process of molding thereof, also exhibits the same effect as that obtained by the method using the ion impact.

EXPERIMENT 5

Although the above description concerns a photomagnetic disk substrate which is an example of substrates comprising organic materials, the technique in accordance with the present invention can be of course applied to other optical recording media having substrates comprising organic materials. The applications of the present invention are not limited to these recording media, and the present invention can be applied to optical lenses and spectacles comprising organic materials.

Figure 1:
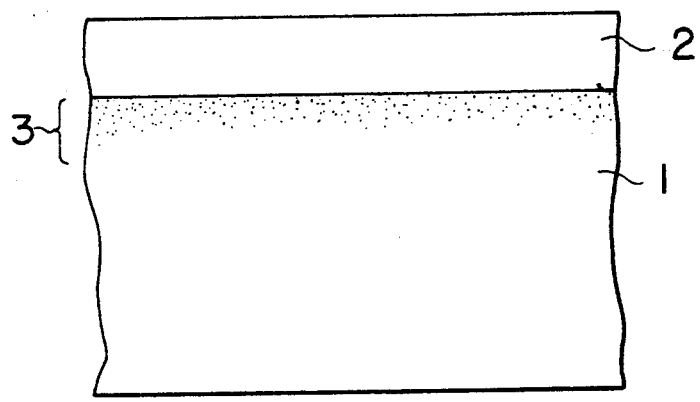
FIG. 1 is a longitudinal sectional view of an embodiment of the structure of a coating on an organic substrate in accordance with the present invention.

An example of optical lenses utilizes the structure shown in FIG. 1 in which it is preferable to use polycarbonate in the organic substrate, an SiN film as a thin film adhered to the substrate and Si as an element to be implanted in the polycarbonate. This structure enabled a strong adhesion of the SiN film and thus enabled the achievement of satisfactory values of the surface strength, reflectance, refractive index and transmittance of the optical lens formed.

On the other hand, a sample as a comparative example was produced by forming a silicon layer under the conditions of a microwave of 270 W, pressure of $2 \times 10^{-3}$ Torr and a rate of SiH$_4$ gas of 6 cc/minute and a rate of 40 cc/minute of Ar gas in a so-called cusp field in which the direction of the magnetic field only of the coil 107 of the two control magnetic coils 106, 107 was reversed, the coil 107 being near the substrate 11 in the above-described electromagnetic field control-type microwave plasma CVD apparatus 100. In the case of the cusp magnetic field, most of the ions were reflected from the reversed magnetic field and thus could not reach the substrate 11. The plasma produced on the surface of the substrate 11 was therefore mainly composed of isotropic radical components and could not be implanted in the substrate 11. Thus only a silicon-deposited film 17 was simply formed on the surface of the substrate 11 with no element being implanted therein. A silicon nitride film 13, a magnetic recording film 14 and a protection film 15 were then formed in turn in the same manner as that comployed in each of the above embodiments. As a result of a high-temperature high-humidity test at 60° C. and 95%, the silicon nitride film 13 was separated from the substrate after about 100 hours had passed.

As can be seen from the above description, when a single metal element or a nitride, oxide, carbide, fluoride or the like thereof is simply deposited on the organic substrate 11, there is no effect of significantly improving the adhesive force.

As described above, it is possible to significantly increase the strength, durability and reliability of the coating structure on an organic substrate comprising the organic substrate and a thin film adhering (formed) thereto.

A description will now be given of the function of the embodiment described below with reference to FIG. 6.

Since a metal or covalent bonding between element atoms is formed between the element contained in an inclusion region 603 in the vicinity of the surface of an organic substrate 601 and the element forming a thin film 602 serving as an upper layer on the substrate 601, a strong adhesive force is present between the substrate 601 and the thin film 602.

It is therefore possible to achieve significant increases in the strength, reliability and durability of a wiring material 604 formed on the organic substrate to which the thin film is caused to adhere (formed).

Figure 2:
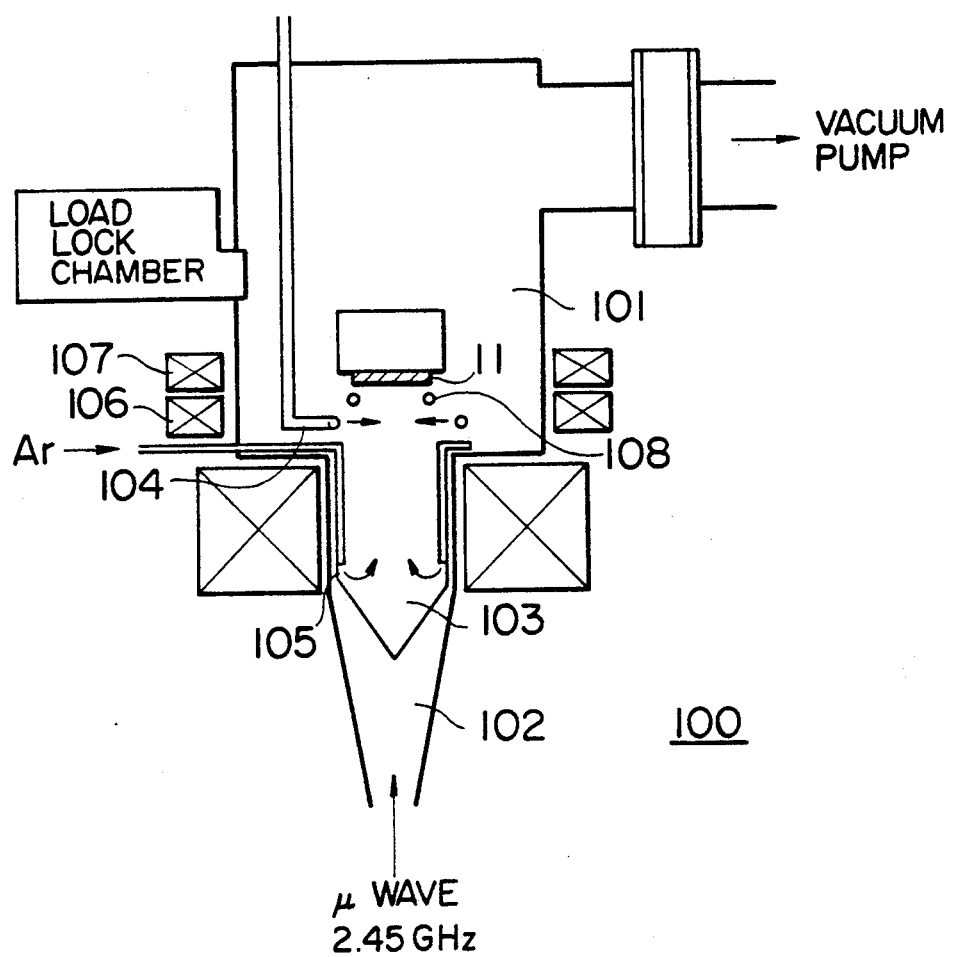
FIG. 2 is a schematic drawing of the structure of an embodiment of the production apparatus in accordance with the present invention.
Figure 7:
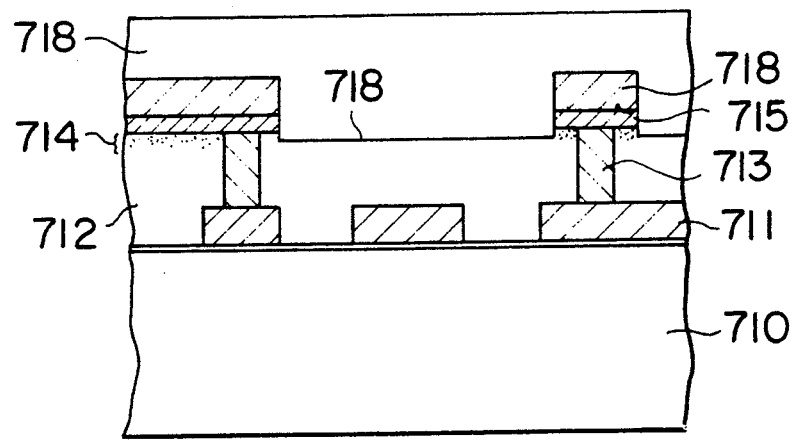
FIG. 7 is a longitudinal sectional view of an embodiment of an integrated circuit device in accordance with the present invention.

FIG. 7 is a sectional view of an embodiment of a semiconductor integrated circuit device. In FIG. 7, reference numeral 710 denotes a silicon substrate and reference numeral 711 denotes a first wiring layer comprising polysilicone. A first organic interlayer film comprising polyimide resin is formed over the entire surface of the first wiring layer. Positions which are to be connected to a second wiring layer are opened by a known photoetching method, and the opened portions are charged with a conductive interlayer wiring material 713. A silicon-containing layer 714 in which silicon is implanted by using one of the apparatuses shown in FIGS. 2 to 4 is then formed over the entire surface of the first organic interlayer film, and a silicon-deposited layer 715 is then formed on the layer 714. The thickness of the deposited layer 715 is preferably as small as possible, for example, 10 to 1000 Å. The thickness of the silicon-containing layer 714 is also preferably as small as possible, for example, 10 to 5000 Å. A Cu film 716 serving as a second wiring layer is then formed and subjected to patterning using combination of a photolitho process and dry etching process such as ion milling. At the same time, unnecessary portions of the silicon-deposited layer 715 and the silicon-containing layer 714 are also removed by etching to form etching grooves 717, whereby preventing any short circuit of wiring. An organic protection film 718 serving as a final passivation film is then formed. If a third wiring layer is required, the organic protection film 718 serves as a second organic inter layer film, and a silicon-containing layer 714, a silicon-deposited layer 715 and the third wiring layer are formed in turn.

In this Example, the semiconductor integrated circuit device is formed by, for example, using the electromagnetic field control-type microwave plasma CVD apparatus 100 shown in FIG. 2 which is a microwave plasma treatment apparatus. The method and procedure of producing the device are described in detail below.

EXAMPLE 6

The silicon substrate 710 shown in FIG. 7 on which the first organic interlayer film 712 and the films below it were formed was first placed in the sample chamber 101. A plasma was generated in an atmosphere of argon (Ar) gas at $2 \times 10^{-3}$ Torr in the plasma generation chamber 103 using a microwave of 300 to 500 W which was introduced from the microwave waveguide 102. At the same time, monosilane ($SiH_4$) gas was introduced at a rate of 6 cc/minute through the nozzles 104 provided adjacent to the substrate 710. The $SiH_4$ gas was then decomposed by the Ar gas introduced from the plasma generation nozzles 105 which were formed through the plasma generation chamber 103 so that silicon atoms are implanted in the first organic interlayer film 712. The amount of the silicon atoms implanted was controlled by controlling the magnetic fields generated by the control magnetic coils 106, 107 which were provided outside the vacuum container. The amount of the ions that reached the substrate 710 was increased by bringing the electron cyclotron resonance region (875 gauss) close to the substrate 710 while separately controlling the two control magnetic coils 106, 107. In this Example, the distance between the substrate 710 and the electron cyclotron resonance region was within the range of 0 to 12 cm. Since the lower the pressure, the longer the average free path of electrons, pressure also greatly affects implantation of silicon atoms in the substrate 710. After the silicon (atom)-containing layer 714 has been formed by the above-described method, the output of the microwave was set to be 300 W or less, and the distance between the substrate 710 and the electron cyclotron resonance region was set to be 12 cm or more. In this state, the silicon-deposited layer 715 having a thickness of 10 to 5000 Å was formed at the same pressure ($2 \times 10^{-3}$ Torr) or lower. The substrate 710 was then transferred into another vacuum container in which the Cu film with a given thickness serving as the second wiring layer was deposited by a known sputtering method. The substrate was then etched using a known photolitho method and ion milling method to form a given pattern, as well as unnecessary portions of the silicon-deposited layer 715 and the silicon-containing layer 714 being removed by etching. The organic protection film 718 was then formed.

The inventors also conducted experiments as comparative examples in which, after the substrate 710 had been placed in the sample chamber, a plasma was generated using $N_2$ and then mixed with $SiH_4$ (that is, a silicon nitride film was deposited directly on the substrate 710), and in which, after the substrate 710 had been placed in the sample chamber, a plasma was generated using $O_2$ and then mixed with $SiH_4$ (that is, a silicon oxide film was deposited directly on the substrate 710). The results of peel tests showed that cracks or separations occur at about 50 g/cm.

EXAMPLE 7

Another embodiment of the present invention was achieved by the following method:

$SiH_4$ gas at 6 cc/minute and Ar gas at 40 cc/minute were simultaneously caused to flow while a negative bias voltage being applied to the grid electrode 108 which was provided adjacent to the substrate support base in the above-described electromagnetic field control-type microwave plasma CVD apparatus 100, as shown in FIG. 3. Ar ions and Si atom ions produced by decomposition or $SiH_4$ were led in the grid electrode 108 thus implanted in the substrate 710 adjacent to the grid electrode 108 to form a silicon-containing layer 714. In the state wherein the potential of the grid electrode 2as zero, the $SiH_4$ gas and Ar gas were continuously cause to flow to form a silicon-deposited layer 715 with a given thickness. A second wiring layer 716 and an organic protection film 718 were then formed in the same way as that employed in Example 1.

EXAMPLE 8

A further embodiment of the present invention is as follows:

A substrate 710 was placed in the sample chamber 101 of the electromagnetic field control-type microwave plasma CVD apparatus 100 provided with the high-frequency oscillator (RF), as shown in FIG. 4, in the same way as that described above. A plasma was generated with a microwave output of 270 W at pressure of $2 \times 10^{-3}$ Torr and a flow rate of monosilane gas of 6 cc/minute and a flow rate of argon gas of 40 cc/minute. RF output 50 W was superposed on the side of the substrate 710 to form a silicon-containing layer 714 in the polyimide resin in the vicinity of the surface thereof.

Only the RF output was then cut off, and a silicon-deposited layer 715 was formed on the surface of the polyimide resin using only the microwave output 270 W. A second wiring layer 716 and an organic protection layer 718 were then formed in turn in the same manner as in FIG. 7 to obtain the same structure as that shown in FIG. 7.

EXAMPLE 9

A still further embodiment of the present invention could be achieved by the following method:

A substrate 710 was placed in the sample chamber 101 of the electromagnetic field control-type plasma CVD apparatus 100 provided with the RF oscillator in the same way as that described above. Plasma treatment was effected at pressure of $5 \times 10^{-3}$ Torr using a gas mixture of monosilane gas at a rate of 6 c/minute and argon gas at a rate of 40 cc/minute and using only RF output of 300 to 500 W without using any microwave, to form a silicon-containing layer 714 and a silicon-deposited layer 715 on the surface thereof. A second wiring layer 716 and an organic protection layer 718 were then formed in turn by the same way as in FIG. 7 to obtain the same structure as that shown in FIG. 7.

EXAMPLE 10

Figure 8:
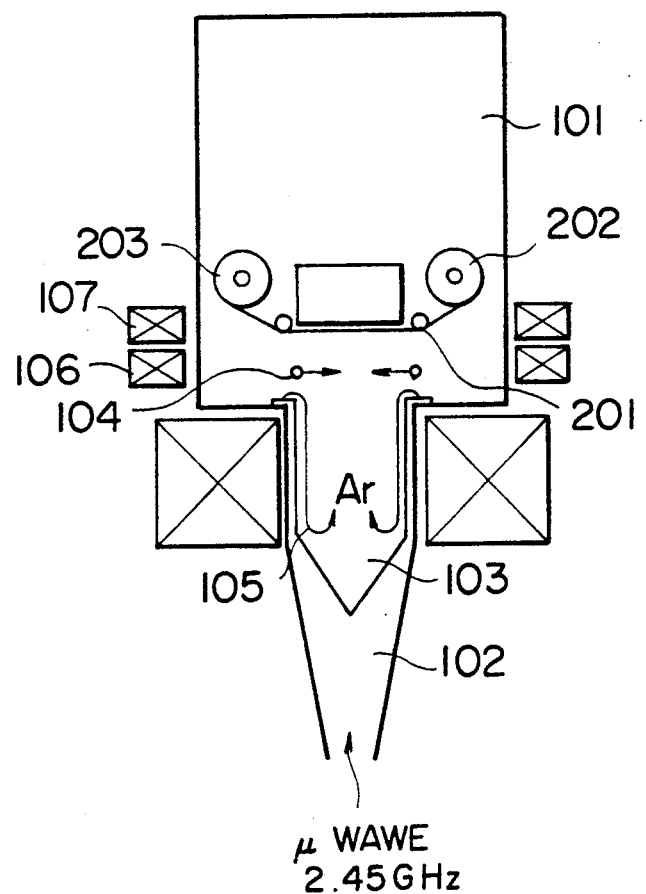
FIG. 8 is a sectional view of an embodiment of the production method in accordance with the present invention.

A still another embodiment of the present invention could be achieved by the following method:

A roll 202 of a tape carrier 201 having the form of a film such as a polyimide thin film or a tape in which polyimide was laminated on a Cu foil was disposed on one side in the vacuum container of the plasma CVD apparatus 100, and a take-up roll 203 was disposed on the other side, as shown in FIG. 8. This is a so-called roll to roll method. In this case, it is matter of course that an element-implanted layer, deposited layer and wiring layer can be continuously formed without being exposed to air.

When each of the thus-formed test pieces was subjected to a peel test, adhesive force of about 500 g/cm which was about 10 times those of conventional structures could be achieved. During the peel tests, each of the separated portions was at the boundary between the first wiring layer 711 and the first organic interlayer film 712. It was thus found that the adhesive force between the first organic interlayer film 712 and the second wiring layer 716 is 500 g/cm or more, leading to the achievement of the objects of the present invention.

On the other hand, Table 2 shows examples in which metal and semi-metals except for silicon were used as elements to be implanted in the resin substrates. In all the cases, the organic substrates were made of polyimide resin, and the implantation method was the same as that employed in Embodiment 3. As a result of peel tests, the structures formed were satisfactory without producing either separation or cracks.

TABLE 2

| Examples using Other Elements | | | | | |
|---|---|---|---|---|---|
| Element implanted | Gas or liquid used | Method of generating plasma and implanting element | Time (min) | Deposited layer | Result of peel test (separation) |
| Ti | Ti(OC$_2$H)* | μ wave (270 W) + RF (100 W) | 3 | Ti | No |
| Al | Al(CH)* | μ wave (270 W) + RF (100 W) | " | Al | No |

TABLE 2-continued

| Examples using Other Elements | | | | | |
|---|---|---|---|---|---|
| Element implanted | Gas or liquid used | Method of generating plasma and implanting element | Time (min) | Deposited layer | Result of peel test (separation) |

*The liquid was introduced into the vacuum container while being bubbled with an Ar gas under heating.

In each of the embodiment, the organic substrate was made of polyimide resin, the metal element implanted in the organic substrate was silicon, and the wiring material used was Cu. However, other substrates that may be used include plastic substrates made of polymethacrylate, polyolefins, bisphenol, polyvinyl chloride, polyethylene terephthalate, polyphenylene sulfide, polyether ether ketone, polyether imide and the like and resins comprising these resins or other resins and fluorine and Si. In this case, it is necessary to use the constituent element of the deposited film, i.e., Ta must be used as an element to be contained in the organic substrate when Ta is deposited, and Ti must be used when Ti is deposited, When a metal compound is deposited, it is also necessary to use the element comprising the deposited film for example, Ti or N must be used when TiN deposited, and Ta or N must be used when TaN is deposited, Any conductive materials such as Al as well as other metals and silicon materials may be used as the wiring material.

The production method employed in each of the embodiments is the method in which an element is implanted in the organic substrate using the microwave plasma and RF plasma. However, a given element may be implanted using ion etching, an ion implantation method or a method in which SiH$_4$ and Ar gases are mixed in a sputtering apparatus, and in which a negative bias voltage is applied to the substrate side, with the same effect being obtained.

The same effect can be obtained by another method in which an element is implanted using an ion impact, for example, a method in which a metal element is impregnated in an organic resin apart from the above-described method.

Although the above description concerns the semiconductor integrated circuit device as an example which uses an organic substrate, it is matter of course that the technique of the present invention can be applied to other substrates comprising organic materials. Applications of the present invention are not limited to these substrates, and the present invention can be applied to flexible wiring substrates comprising organic materials.

Figure 6:
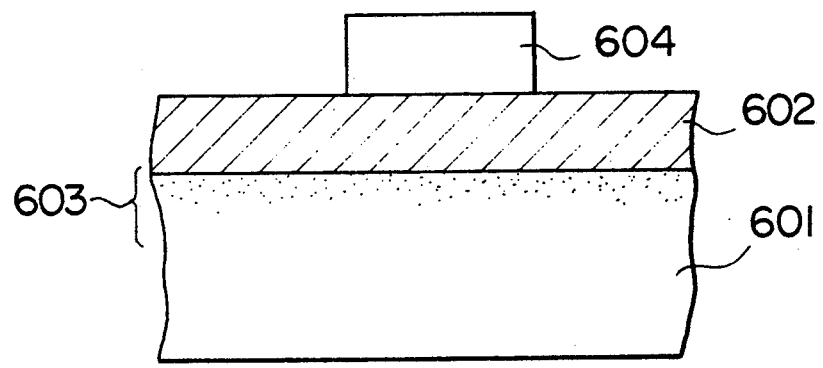
FIG. 6 is a longitudinal sectional view of the structure of wiring on an organic substrate which is provided for explaining the present invention.

Such flexible wiring materials have, for example, the structure shown in FIG. 6 in which it is preferable to use polyimide resin as an organic substrate, a Si film as a thin film to be adhered to the organic substrate and Si as an element to be implanted to the polyimide resin.

On the other hand, a sample was formed as a comparative example by forming a silicon layer under the conditions of a microwave output of 270 W, pressure of $2 \times 10^{-3}$ Torr, a rate of SiH$_4$ gas of 6 cc/minute and a rate of Ar gas of 40 cc/minute in a so-called cusp magnetic field in which only the coil 107 of the two control magnetic oils 106, 107 had the reversed magnetic direction, the coil 107 being near the substrate 710 in the electromagnetic field control-type microwave plasma CVD apparatus 100. In the case of the cusp magnetic field, most of the ions were reflected from the reversed magnetic field and thus could not reach the substrate 710. The plasma generated on the surface of the substrate 710 was therefore composed of isotropic radical components which were not implanted in the polyimide resin of the substrate 710. Thus a silicon-deposited layer 715 alone was simply formed on the surface of the substrate 710. A wiring layer 716 and a protection layer 718 were then formed in turn by the same method employed in each of the embodiments. When a peel test was conducted, the wiring material layer 716 was separated at a force of about 10 g/cm.

As can be seen from the above description, if a single element such as Si or the like or a nitride, oxide, carbide, fluoride of the like thereof is simply deposited on the organic thin film 712, there is no effect of significantly improving the adhesive force.

As described above, it is possible to significantly increase the strength, durability and reliability of the wiring structure on an organic substrate having a wiring material adhering (formed) to the organic substrate.

What is claimed is:

1. A coating structure comprising a substrate of an organic material and a thin film of an inorganic material which is caused to adhere to a surface of the substrate, a first element forming at least a part of the inorganic material and a second element being contained in said organic material and being located in the vicinity of the surface of the substrate, said second element producing a metal bonding with said first element; said thin film comprising as a main material at least one material selected from the group consisting of silicates, oxides, nitrides, carbides and fluorides, of said first element; said second element being present at a depth in the range of 10–5000 Å from the surface of said substrate.

2. A coating structure according to claim 1, wherein said thin film is composed of said second element as a main constituent element.

3. A coating structure according to claim 1, wherein said first element is at least one element selected from the group consisting of Si, Ti, Ta, Al, C, Zr, In, Sn, Mo, Cr, Ge, Mg and Mn.

4. A coating structure according to claim 1, wherein said second element is at least one element selected from the group consisting.

5. A coating structure according to claim 1, wherein said second element which produces a metal bonding with the first element is implanted into said organic substrate in the vicinity of the surface thereof.

* * * * *